US008665631B2

(12) United States Patent
Huo et al.

(10) Patent No.: US 8,665,631 B2
(45) Date of Patent: Mar. 4, 2014

(54) RESISTIVE RANDOM MEMORY CELL AND MEMORY

(75) Inventors: Zongliang Huo, Beijing (CN); Ming Liu, Beijing (CN); Manhong Zhang, Beijing (CN); Yanhua Wang, Beijing (CN); Shibing Long, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 127 days.

(21) Appl. No.: 13/502,832

(22) PCT Filed: Jun. 30, 2011

(86) PCT No.: PCT/CN2011/076681
§ 371 (c)(1),
(2), (4) Date: Apr. 19, 2012

(87) PCT Pub. No.: WO2012/100501
PCT Pub. Date: Aug. 2, 2012

(65) Prior Publication Data
US 2012/0281452 A1 Nov. 8, 2012

(30) Foreign Application Priority Data

Jan. 25, 2011 (CN) .......................... 2011 1 0026944

(51) Int. Cl.
*G11C 11/00* (2006.01)
(52) U.S. Cl.
USPC .......................................... 365/148; 365/173
(58) Field of Classification Search
USPC .......... 365/148, 158, 171, 173; 257/295, 427, 257/3
See application file for complete search history.

(56) References Cited
U.S. PATENT DOCUMENTS
7,359,226 B2 * 4/2008 Schwerin .................... 365/49.1
8,203,875 B2 * 6/2012 Amin et al. .................... 365/175
(Continued)

FOREIGN PATENT DOCUMENTS
CN 101101964 A 1/2008
(Continued)

OTHER PUBLICATIONS
International Search Report and Written Opinion for PCT Application No. PCT/CN2011/076681, dated Oct. 27, 2011, 9 pages.

*Primary Examiner* — Gene Auduong
(74) *Attorney, Agent, or Firm* — Westman, Champlin & Koehler, P.A.

(57) ABSTRACT

The present disclosure provides a resistive random memory cell and a resistive random memory. The resistive random memory cell comprises an upper electrode, a resistive layer, an intermediate electrode, an asymmetric tunneling barrier layer, and a lower electrode. The upper electrode, the resistive layer, and the intermediate electrode constitute a resistive storage portion. The intermediate electrode, the asymmetric tunneling barrier layer, and the lower electrode constitute a selection portion. The resistive storage portion and the selection portion share the intermediate electrode. The selection portion may be disposed above or under the resistive storage portion. The asymmetric tunneling barrier layer comprises at least two materials having different barrier heights, and is configured for rectifying forward tunneling current and reverse tunneling current flowing through the resistive random memory cell. The present disclosure uses the asymmetric tunneling barrier layer for rectifying, so as to enable selection of the resistive random memory cell. The method for manufacturing the asymmetric tunneling barrier layer does not involve doping or high-temperature annealing processes, and the thickness of the asymmetric tunneling barrier layer is relatively small, which helps 3D high-density integration of the resistive random memory.

11 Claims, 4 Drawing Sheets

(56) References Cited

U.S. PATENT DOCUMENTS

| | | | |
|---|---|---|---|
| 8,288,749 B2* | 10/2012 | Kim et al. | 257/2 |
| 2003/0128580 A1* | 7/2003 | Park et al. | 365/158 |
| 2004/0174756 A1* | 9/2004 | Kunikiyo et al. | 365/200 |
| 2006/0039183 A1* | 2/2006 | Lin et al. | 365/158 |

FOREIGN PATENT DOCUMENTS

| | | |
|---|---|---|
| CN | 101179095 A | 5/2008 |
| CN | 101425559 A | 5/2009 |
| CN | 101828236 A | 9/2010 |

* cited by examiner

RESISTIVE RANDOM MEMORY CELL AND MEMORY

This application is a National Phase application of, and claims priority to, PCT Application No. PCT/CN2011/076681, filed on Jun. 30, 2011, entitled "RESISTIVE RANDOM MEMORY CELL AND MEMORY", which claimed priority to Chinese Application No. 201110026944.2, filed on Jan. 25, 2011. Both the PCT Application and Chinese Application are incorporated herein by reference in their entireties.

TECHNICAL FIELD

The present disclosure pertains to the technical field of microelectronics and memory. In particular, the present disclosure pertains to a resistive random memory cell and a resistive random memory for high-density data storage.

BACKGROUND

Resistive Random Access Memory (RRAM) as a newly-emerging non-volatile storage technology has great advantages compared with FLASH in various aspects, such as cell area, device density, power consumption, programming/erasing speed, 3D (three-dimensional) integration, and multi-value implementation, and therefore draws much attention of both domestic and abroad companies as well as research institutions. With a continuous development, the resistive random memory has become one of the most competent candidates for mainstream products of the future non-volatile memory.

The resistive random memory has a simple memory cell structure of electrode/insulating layer/electrode. As a result, an 1R intersection array structure is a very ideal storage array structure, which enables 3D integration with a very high density. In the intersection array structure, memory cells are arranged at parallel intersectional points which are aligned in a vertical direction, wherein each memory cell can be selected and accessed. However, due to symmetrical electrical characteristics of the memory cells, the 1R intersection array structure has a serious read crosstalk problem.

FIG. 1 is a schematic view showing the read crosstalk problem in a resistive random memory in the prior art. As shown in FIG. 1, each memory comprises an upper electrode, a resistive layer, and a lower electrode. The process for manufacturing the array structure is simple, and the array structure is easy to be three-dimensionally integrated at low cost and with a high density. However, the structure has an obvious read crosstalk problem. FIG. 1 shows four adjacent memory cells, wherein a memory cell at a position (1, 1) is at a high-resistance state, while the other three memory cells at positions (1, 2), (2, 2), and (2, 1) are all at a low-resistance state. A solid line in FIG. 1 shows a desired current path when a read voltage is applied on the memory cell at the position (1, 1). In contrast, a spotted line in FIG. 1 shows an actual current path, as a result of which a resistance value being read out is not the resistance value of the memory cell at the position (1, 1). This is an example of the read crosstalk problem.

The read crosstalk problem is typically solved by means of a selection unit, as in an 1T1R structure or an 1D1R structure. The cell area in an integration scheme using the 1T1R structure is determined by transistors. A smallest area of a resistive random memory cell having the 1T1R structure is $6F^2$, if influence of driving current of the transistors is not taken into consideration, wherein F is a feature line-width. As a result, the 1T1R structure cannot be used in high-density array integration, while the 1D1R structure is considered to be more competent for application.

FIG. 2 is a schematic view of a resistive random memory having the 1D1R structure of the prior art. As shown in FIG. 2, in a resistive random memory cell, the read cross problem can be effectively solved by connecting a rectifying diode with a resistive layer in serial. The rectifying diode is implemented by a PN junction. The resistive layer is typically formed of a metal material. The process for manufacturing the 1D1R cell comprising the PN junction rectifying diode comprises n-type doping and p-type doping processes in formation of the PN junctions, and a subsequent high-temperature activation process. As a result, 3D integration of the 1D1R cells (shown in FIG. 2) is very complex and difficult to control. The PN junction typically has a thickness of more than 100 nm, which also constitute an obstacle to the 3D integration. Furthermore, a polysilicon PN junction diode can provide high Set/Reset current required by the resistive random memory cell, but it has large leakage current. These factors are all disadvantageous to the integration of the resistive random memory cells utilizing the typical polysilicon PN junction rectifying devices. Therefore, implementation of the 3D high-density integration of the resistive random memory cells having the 1D1R structure has become an important topic of memory technology.

The inventor has noticed that the prior art has a problem that in the resistive random memory cell having the 1D1R structure, which utilizes the PN junction as the selection unit, the 3D high-density integration is difficult due to the doping process and the high-temperature activation process.

SUMMARY

Problems to be Solved

In view of the foregoing situation, the present disclosure provides, among other things, a resistive random memory cell and a resistive random memory, which implement current selection function without using any PN junction(s). In this way, it is possible to achieve 3D high-density integration of the resistive random memory cells.

Technical Solutions

According to an aspect of the present disclosure, there is provided a resistive random memory cell. The resistive random memory cell comprises an upper electrode, a resistive layer, an intermediate electrode, an asymmetric tunneling barrier layer, and a lower electrode. The upper electrode, the resistive layer, and the intermediate electrode constitute a resistive storage portion. The intermediate electrode, the asymmetric tunneling barrier layer, and the lower electrode constitute a selection portion. The resistive storage portion and the selection portion share the intermediate electrode. The selection portion may be disposed above or under the resistive storage portion. The asymmetric tunneling barrier layer comprises at least two materials having different barrier heights, and is configured for rectifying forward tunneling current and reverse tunneling current flowing through the resistive random memory cell.

Optionally, in the resistive random memory cell according to the present disclosure, the at least two materials forming the asymmetric tunneling barrier layer and their respective thicknesses may be selected based on predetermined rectifying characteristics. The respective barrier heights of the at least two materials may monotonously increase or monotonously decrease from bottom to top.

Optionally, in the resistive random memory cell according to the present disclosure, the electrode at a high-barrier material side of the asymmetric tunneling barrier layer may comprise a conductive material with a low work-function. The electrode at a low-barrier material side of the asymmetric tunneling barrier layer may comprise a conductive material with a high work-function.

Optionally, in the resistive random memory cell according to the present disclosure, the at least two materials having different barrier heights may be selected from a group consisting of $SiO_2$, SiON, $Si_3N_4$, $HfO_2$, $Al_2O_3$, $ZrO_2$, HfAlO, HfSiO, AlSiO, $Ta_2O_5$, and $HfO_2$. Each of the at least two materials may have a thickness of about 0.5 nm~50 nm. The asymmetric tunneling barrier layer may be any one of $SiO_2$/$Si_3N_4$, $SiO_2$/$Al_2O_3$, $SiO_2$/$HfO_2$, SiON/$HfO_2$, SiON/$Al_2O_3$, $Al_2O_3$/$HfO_2$, $Al_2O_3$/$SiO_2$, and $HfO_2$/SiON. Alternatively, the asymmetric tunneling barrier layer may be any one of $SiO_2$/$Al_2O_3$/$HfO_2$, SiON/$Al_2O_3$/$HfO_2$, and $SiO_2$/SiON/$HfO_2$.

According to another aspect of the present disclosure, there is provided a resistive random memory. The resistive random memory comprises a resistive read/write unit, an address selection unit, and a plurality of the resistive random memory cells as described above. The address selection unit is connected with the plurality of resistive random memory cells and is configured for selecting the resistive random memory cell to be operated. The resistive read/write unit is connected with the address selection unit and the plurality of resistive random memory cells and is configured for setting, resetting, or programming the selected resistive random memory cell.

Beneficial Effects

The present disclosure at least has the following beneficial effects.
1) According to the present disclosure, the asymmetric tunneling barrier layer has a thickness much less than that of the PN junction diode in the 1D1R structure. For example, the thickness of the asymmetric tunneling barrier layer may be less than about 10 nm, while the thickness of the polysilicon PN junction diode is, for example, about 100 nm. As a result, the memory cell structure is very close to the ideal 1R structure with respect to the integration density, and whereby 3D high-density integration is possible.
2) According to the present disclosure, the process for forming the asymmetric tunneling barrier layer, which is used for selecting the resistive region, is very simple. The doping and annealing processes in manufacturing the conventional polysilicon PN junction rectifying diode can be avoided, and whereby process complexity and manufacturing cost are substantially reduced.
3) According to the present disclosure, an 1TB1R structure based on the asymmetric Tunneling Barrier (TB) is formed. Voltages of different polarities are applied to both sides of the asymmetric tunneling barrier, respectively, so that a large difference (e.g., by about five orders of magnitude) between forward tunneling current and reverse tunneling current of the 1TB1R structure can be achieved by adjusting asymmetric barrier heights and tunneling thicknesses. Therefore, rectifying characteristic can be effectively achieved by such a structure.
4) The asymmetric tunneling barrier layer may comprise high-K materials with different barrier heights. For example, the asymmetric tunneling barrier layer may comprise any one of $SiO_2$/$Al_2O_3$, $SiO_2$/$HfO_2$, and SiON/$HfO_2$, etc. The asymmetric tunneling barrier layer may also comprise other materials which have been widely used in CMOS process. Therefore, the structure according to the present disclosure is well compatible with CMOS processes.
5) The read crosstalk problem of the 1R intersectional array can be effectively addressed by using the asymmetric tunneling barrier layer as the selection unit. Therefore, the structure according to the present disclosure can be applied in intersectional storage array design.

DETAILED DESCRIPTION OF EMBODIMENTS

The present disclosure will be further explained in detail in connection with specific embodiments and with reference to the drawings, so that objects, technical solutions and beneficial effects thereof will become more apparent.

Figure 3:
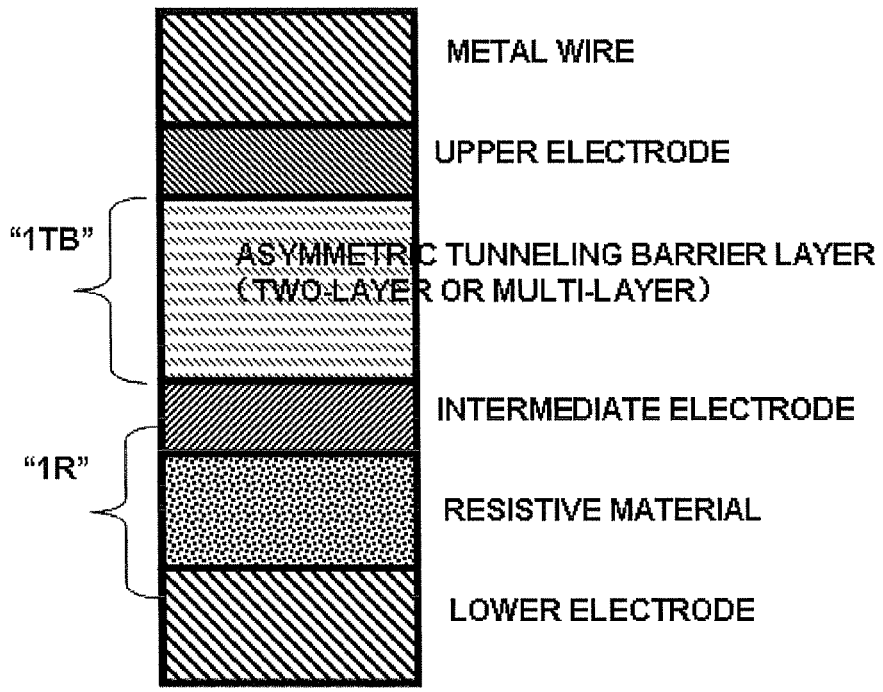
FIG. 3 is a schematic view of an embodiment of a resistive random memory cell according to the present disclosure.
Figure 4:
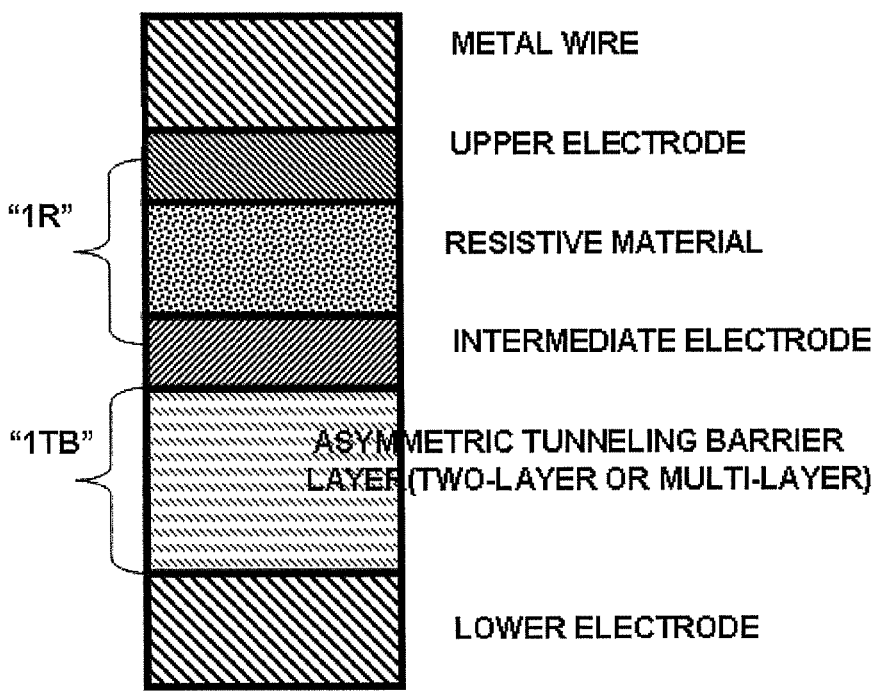
FIG. 4 is a schematic view of another embodiment of a resistive random memory cell according to the present disclosure.

According to an exemplary embodiment of the present disclosure, there is provided a resistive random memory cell. The resistive random memory cell comprises an upper electrode, a resistive layer, an intermediate electrode, an asymmetric tunneling barrier layer, and a lower electrode. The upper electrode, the resistive layer, and the intermediate electrode constitute a resistive storage portion. The intermediate electrode, the asymmetric tunneling barrier layer, and the lower electrode constitute a selection portion. The resistive storage portion and the selection portion share the intermediate electrode. The selection portion may be disposed above or under the resistive storage portion. FIG. 3 shows an exemplary structure of a resistive random memory cell, in which the selection portion is disposed above the resistive storage portion. FIG. 4 shows an exemplary structure of another resistive random memory cell, in which the selection portion is disposed under the resistive storage portion. The asymmetric tunneling barrier layer comprises at least two materials having different barrier heights, and is configured for rectifying forward tunneling current and reverse tunneling current flowing through the resistive random memory cell. Optionally, in the resistive random memory cell according to the present disclosure, the at least two materials forming the asymmetric tunneling barrier layer and their respective thicknesses may be selected based on predetermined rectifying characteristics.

The asymmetric tunneling barrier layer according to the present embodiment is used for rectifying and whereby enabling selection of the resistive random memory cells. The process for manufacturing the asymmetric tunneling barrier layer does not involve doping or annealing processes, and the asymmetric tunneling barrier layer has a respectively small thickness, which helps 3D high-density integration of resistive random memory. The intermediate electrode, which is formed by an additional step, improves reliability of the resistive random memory cell.

Optionally, the electrode at a high-barrier material side of the asymmetric tunneling barrier layer may comprise a conductive material with a low work-function. The electrode at a low-barrier material side of the asymmetric tunneling barrier layer may comprise a conductive material with a high work-function. Reverse leakage current can be reduced by adjusting the work-function of the conductive material of the intermediate electrode and the work-function of the conductive material of the lower electrode. In this way, a rectifying ratio can be increased.

Optionally, the asymmetric tunneling barrier layer may comprise at least two materials having different barrier heights. The at least two materials having different barrier heights may be selected from a group consisting of $SiO_2$, SiON, $Si_3N_4$, $HfO_2$, $Al_2O_3$, $ZrO_2$, HfAlO, HfSiO, AlSiO, $Ta_2O_5$, and $HfO_2$. The at least two materials constituting the asymmetric tunneling barrier layer may each have a thickness of about 0.5 nm~50 nm. Optionally, a total thickness of the asymmetric tunneling barrier layer may be about 10 nm~50 nm. According to an embodiment, the asymmetric tunneling barrier layer may be a two-layer asymmetric tunnelling barrier layer selected from a group consisting of $SiO_2/Si_3N_4$, $SiO_2/Al_2O_3$, $SiO_2/HfO_2$, $SiON/HfO_2$, $SiON/Al_2O_3$, $Al_2O_3/HfO_2$, $Al_2O_3/SiO_2$, and $HfO_2/SiON$. Alternatively, the asymmetric tunneling barrier layer may be a three-layer asymmetric tunneling barrier layer selected from a group consisting of $SiO_2/Al_2O_3/HfO_2$, $SiON/Al_2O_3/HfO_2$, and $SiO_2/SiON/HfO_2$. The asymmetric tunneling barrier layer may be formed by any one of: electron beam vaporization, chemical vapor deposition, pulse laser deposition, atom layer deposition, magnetron sputtering, and oxidation.

Figure 5:
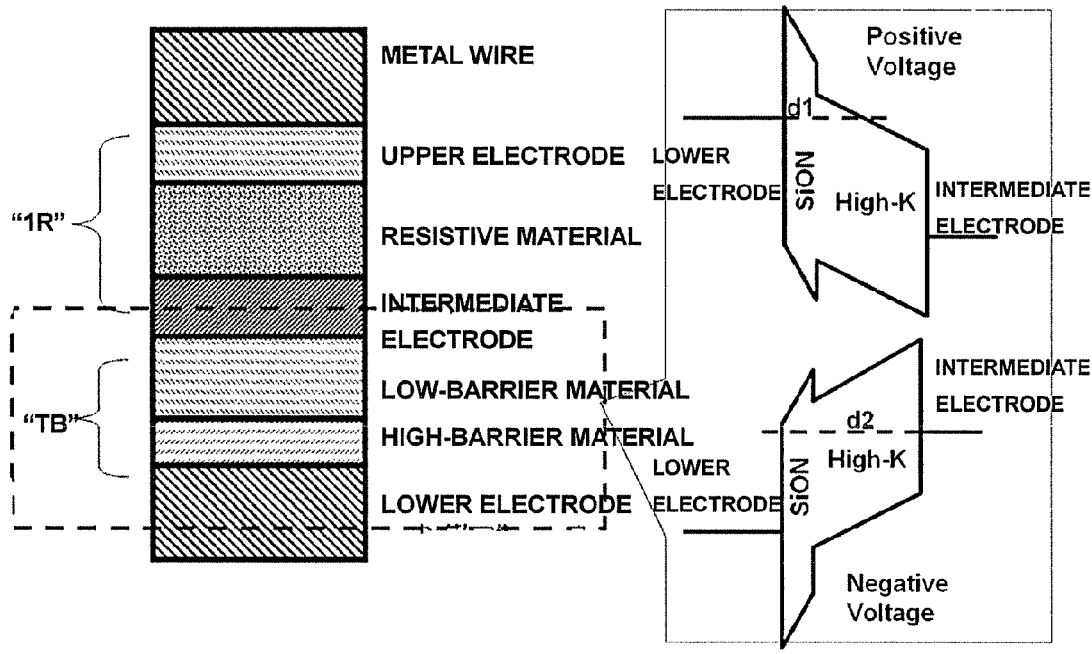
FIG. 5 is a schematic view of a resistive random memory cell according to an embodiment of the present disclosure.

FIG. 5 is a schematic view of a resistive random memory cell according to an embodiment of the present disclosure. A left portion of FIG. 5 shows a structural diagram of the resistive random memory cell. A right portion of FIG. 5 shows an energy-band diagram of a selection portion of the resistive random memory cell. The next description will be given in connection with the two diagrams for simplicity of explanation.

As shown in the left portion of FIG. 5, the resistive random memory cell comprises a resistive storage portion (1R) and a selection portion (TB). The selection portion is disposed under the resistive storage portion, and comprises an intermediate electrode, an asymmetric tunneling barrier layer, and a lower electrode. The asymmetric tunneling barrier layer comprises a low-barrier material layer and a high-barrier material layer. Voltages of different polarities are applied to both sides of the asymmetric tunneling barrier, respectively, so that a large difference (e.g., by about five orders of magnitude) between forward tunneling current and reverse tunneling current of the 1TB1R structure can be achieved by adjusting asymmetric barrier heights and tunneling thicknesses. Therefore, rectifying characteristic can be effectively adjusted by such a structure.

As an example, the two-layer barrier comprises SiON and a high-K material (e.g. $HfO_2$). In the structure shown in FIG. 5, when the upper electrode is connected with a positive voltage, and the lower electrode is connected with a negative voltage or a zero voltage, a voltage of the intermediate electrode is higher than that of the lower electrode. The energy band of the asymmetric barrier is shown in an upper right portion of FIG. 5. A tunneling thickness of electrons tunneling from the lower electrode toward the upper electrode is d1, and a height of tunneling barrier is determined by the material SiON near the lower electrode. Similarly, when the upper electrode is connected with a negative voltage and the lower electrode is connected with a zero voltage or a positive voltage, a tunneling thickness of electrons tunneling from the upper electrode toward the lower electrode is d2, and a height of tunneling barrier is determined by the high-K material $HfO_2$ near the intermediate electrode. As shown in the Figure, d1<d2. Tunneling currents can be controlled by selecting the materials and thicknesses of the materials, and whereby rectifying characteristics of the tunneling currents can be effectively adjusted.

An 1R intersectional array can be implemented using the structure shown in the left portion of FIG. 5. The asymmetric tunneling barrier layer has a thickness much less than that of the PN junction diode in the 1D1R structure. For example, the thickness of the asymmetric tunneling barrier layer may be less than about 10 nm, while a thickness of a polysilicon PN junction diode is, for example, about 100 nm. As a result, the resistive memory cell structure is very close to the ideal 1R structure with respect to the integration density, and whereby 3D high-density integration is possible. Furthermore, a process for forming the structure is very simple. The doping and annealing process in manufacturing the conventional polysilicon RN junction rectifying diode can be avoided, and whereby process complexity and manufacturing cost are substantially reduced.

Figure 6:
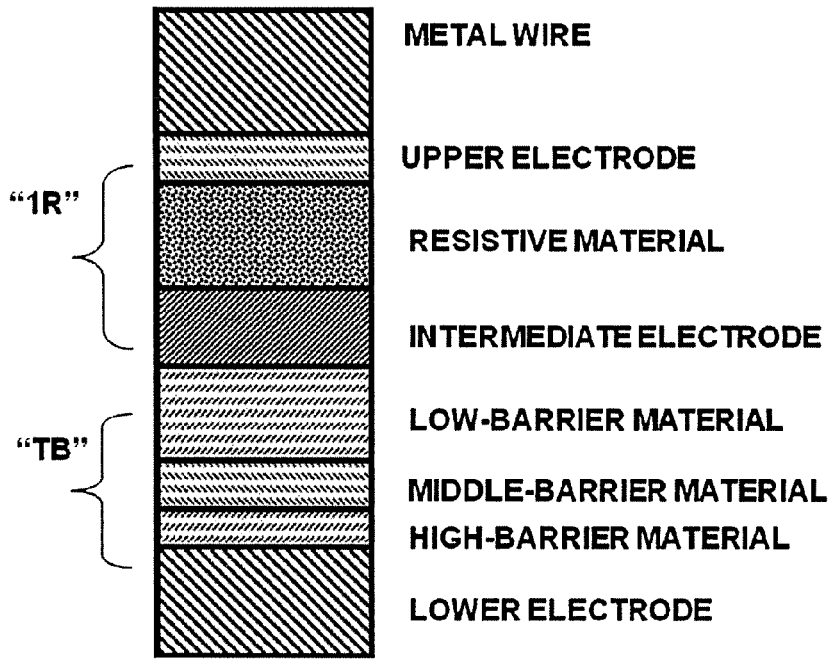
FIG. 6 is a schematic view of a resistive random memory cell according to another embodiment of the present disclosure.

FIG. 6 is a schematic view of a resistive random memory cell according to another embodiment of the present disclosure. Different from the resistive random memory cell shown in FIG. 5, the resistive random memory cell is based on a three-layer asymmetric tunneling barrier. The selection portion comprises a high-barrier material, a middle-barrier material, and a low-barrier material. A basic concept of the three-layer structure is similar as that of the two-layer structure. Currents can be adjusted by setting the barrier heights of the three materials in a monotonously increasing or monotonously decreasing manner. Alternatively, a similar effect can be achieved by selecting proper dielectric constants and thicknesses of the materials, without having to set the barrier heights of the three materials in the monotonously increasing or monotonously decreasing manner. Therefore, any barrier having a current rectifying effect falls within the scope of the present disclosure, even if barrier heights of materials constituting the barrier are not set in the monotonously increasing or monotonously decreasing manner.

In the resistive random memory cells shown in FIG. 5 and FIG. 6, the material near the intermediate electrode has a barrier height less than that of the material near the lower electrode. However, any variations of the structure that are configured for adjusting the currents by an asymmetric barrier should fall within the scope of the present disclosure. Such variations may include structures where a barrier height of the material near the intermediate electrode is larger than that of the material near the lower electrode. Such variations may also include tunneling barriers having more layers.

Figure 7:
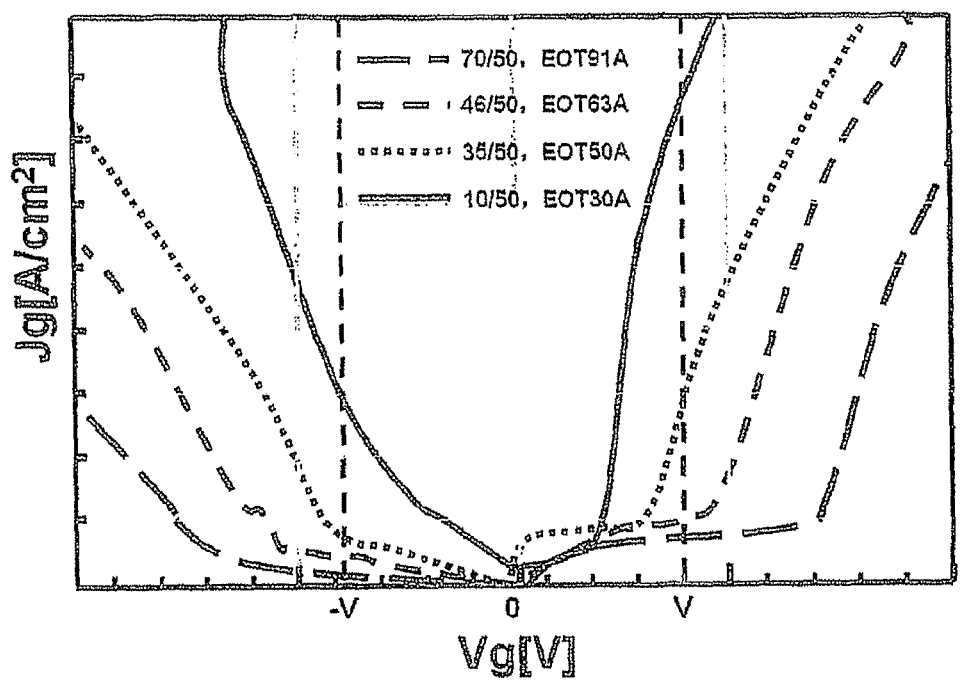
FIG. 7 shows current test curves of $SiO_2$/$Al_2O_3$ stack structures having different thickness ratios in a resistive random memory cell according to an embodiment of the present disclosure.

As described above, predetermined rectifying characteristics can be achieved by selecting materials constituting the asymmetric tunneling barrier layer and thicknesses of the materials. As an example, FIG. 7 shows current test curves of $SiO_2/Al_2O_3$ stack structures having different thickness ratios in a resistive random memory cell according to an embodiment of the present disclosure. A thickness of the $Al_2O_3$ layer is set to of 50 Å, while a thickness of the $SiO_2$ layer is varied. FIG. 7 also shows varied Equivalent Oxide Thicknesses (EOTs) of the SiO$_2$ layer. Taking SiO$_2$(10 Å)/Al$_2$O$_3$(50 Å) as an example, if a dielectric constant of Al$_2$O$_3$ is 9.3, its Equivalent Oxide Thickness EOT is about 30 Å. As shown in the Figure, different dielectric thicknesses correspond to different tunneling current curves. Furthermore, when voltages have a same value but different polarities (e.g., V and −V), a difference between corresponding currents may reach five orders of magnitude. Therefore, requirements on rectifying characteristics of the selection portion can be satisfied. Experimental results shown in FIG. 7 show that by properly selecting the thicknesses of the materials, forward current flowing through the tunneling barrier is larger than reverse current by about five orders of magnitude, and whereby requirements on rectifying characteristics of the selection portion can be satisfied.

Figure 1:
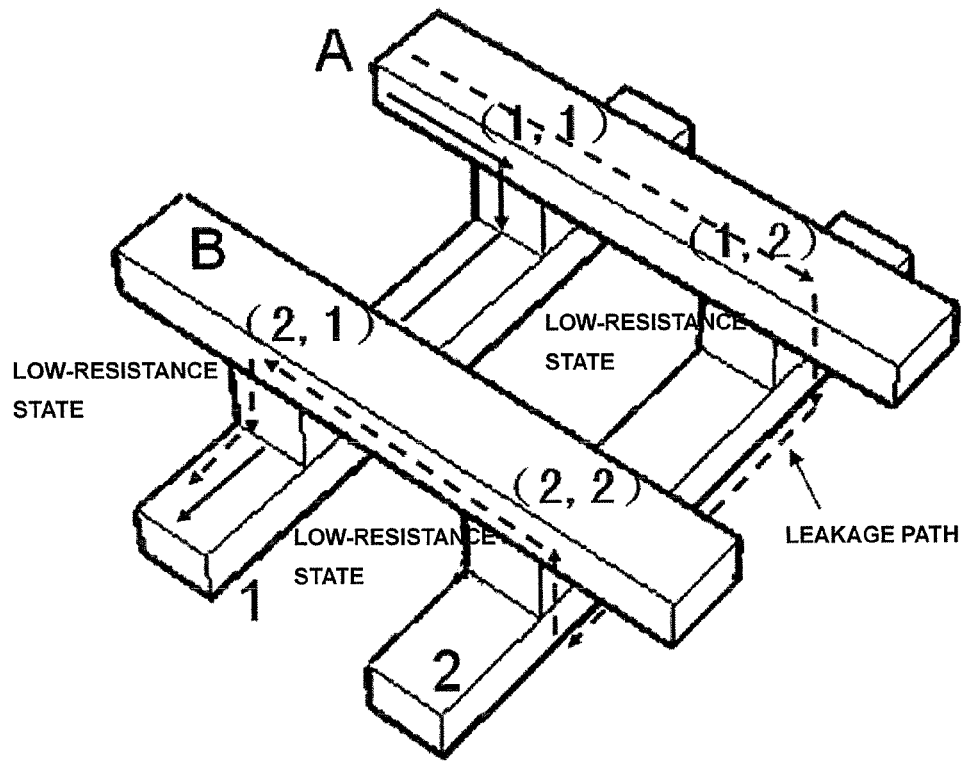
FIG. 1 is a schematic view showing a read crosstalk problem in a resistive memory of the prior art.
Figure 2:
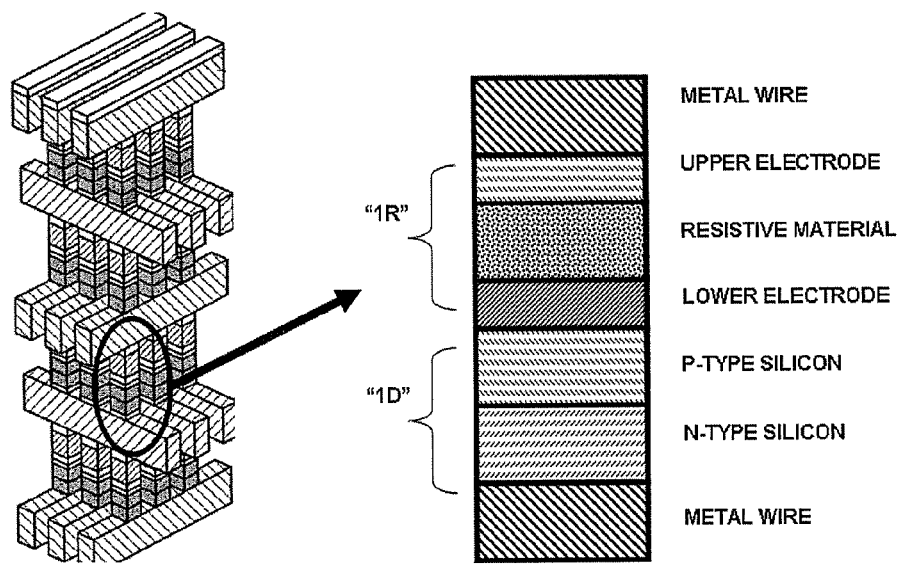
FIG. 2 is a structural view of an 1D1R resistive memory of the prior art.

When the resistive random memory cells are used in the intersectional array of FIG. 1, on a selection path ((1, 1)→(2, 1)), current only passes through one tunneling barrier at (1, 1). However, on a leakage path ((1, 1)→(1, 2)→(2, 2)→(2, 1)), current passes through four tunneling barriers, and thereby leakage current can be effectively suppressed and the crosstalk problem of the intersectional array can be prevented.

The two-layer tunneling barrier (shown in FIG. 5) and the three-layer tunneling barrier (shown in FIG. 6) configured for a rectifying function have been described as above as examples to illustrate the resistive random memory cell. The tunneling barrier may comprise more layers. Any asymmetric tunneling barrier layer configured for rectifying forward tunneling current and reverse tunneling current flowing through the resistive random memory cell should fall within the scope of the present disclosure.

According to the present disclosure, the resistive storage portion may have unipolar or bipolar resistive characteristics. The upper electrode, the intermediate electrode, and the lower electrode may each comprise any one or more of: metal materials such as W, Al, Cu, Au, Ag, Pt, Ru, Ti, Ta, Pb, Co, Mo, Ir, and Ni; conductive metal compounds such as TiN, TaN, WN, IrO$_2$, ITO, NiSi, CoSi, IZO, YBCO, LaAlO$_3$, and SrRuO$_3$; Si; polysilicon; and other conductive electrode materials.

According to the present disclosure, the conductive electrode materials may be deposited by any one of: electron beam vaporization; chemical vapor deposition, pulse laser deposition, atom deposition, and magnetron sputtering. The conductive electrode materials may each have a thickness of about 1 nm~500 nm.

According to the present disclosure, the resistive storage portion may comprise a resistive layer. The resistive layer may comprise any one or more of the following materials, or comprise any one or more of the following materials modified by being doped: NiO$_x$ (0<x<=2); TiO$_x$ (0<x<=2); CuO$_x$ (0<x<=2); ZrO$_x$ (0<x<=2); TaO$_x$ (0<x<=2); WO$_x$ (0<x<=2); HfO$_x$ (0<x<=2); AlO$_y$ (1<y<2); CoO; MoO; ZnO; PCMO; LCMO; SrTiO$_3$; BaTiO$_3$; SrZrO$_3$; CuS; AgS; AgGeSe; CuI$_x$S$_y$ (0<x, y<2); SiO$_2$; Y$_2$O$_3$; Si; amorphous silicon; and organic materials.

According to the present disclosure, the resistive layer of the resistive storage portion may also be implemented by changing a phase state of the material of the resistive layer, as in conventional phase-change memories. The resistive material may comprise any one of various phase-change materials, such as Ge$_2$Sb$_2$Te$_5$ (GST), GeTe, and GeTeC, etc.

According to the present disclosure, the resistive layer may be manufactured by any one of: electron beam vaporization, chemical vapor deposition, pulse laser deposition, atom layer deposition, spin coating, and magnetron sputtering. A thickness of the storage dielectric layer may be about 1~500 nm, and optionally 200 nm.

According to the present disclosure, the asymmetric tunneling barrier layer may comprise one dielectric layer, two dielectric layers, or more dielectric layers. The asymmetric tunneling barrier layer is configured in such a way that a barrier height at a lower electrode side is different from that at an intermediate electrode side. As a result, there is a relatively large difference between currents induced when voltages with difference polarities are applied.

According to the present disclosure, a barrier height of the dielectric material near the middle electrode may be less than that of the dielectric material near the lower electrode (shown in FIG. 3 and FIG. 4). Alternatively, a barrier height of the dielectric material near the middle electrode may be larger than that of the dielectric material near the lower electrode. The asymmetric tunneling barrier layer may comprise two layers (e.g. SiO$_2$/Al$_2$O$_3$, SiO$_2$/HfO$_2$, SiON/HfO$_2$, SiOH/Al$_2$O$_3$, and Al$_2$O$_3$/HfO$_2$), which are formed by two of: SiO$_2$, SiON, Si$_3$N$_4$, HfO$_2$, Al$_2$O$_3$, ZrO$_2$, HfAlO, HfSiO, AlSiO, and Ta$_2$O$_5$. Alternatively, the asymmetric tunneling barrier layer may comprise three layers (e.g. SiO$_2$/HfO$_2$/Al$_2$O$_3$, and SiON/HfO$_2$/Al$_2$O$_3$, etc.), formed by three of: SiO$_2$, SiON, Si$_3$N$_4$, HfO$_2$, Al$_2$O$_3$, ZrO$_2$, HfAlO, HfSiO, AlSiO, and Ta$_2$O$_5$.

The asymmetric tunneling barrier layer may be manufactured by any one of: electron beam vaporization, chemical vapor deposition, pulse laser deposition, atom layer deposition, magnetron sputtering, and oxidation, etc. A thickness of each material may be about 0.5 nm~50 nm, and optionally 20 nm.

According to another aspect of the present disclosure, there is provided a resistive random memory. The resistive random memory comprises a resistive read/write unit, an address selection unit, and a plurality of the resistive random memory cells as described above.

In the foregoing description about the semiconductor memory cell, the memory device, and the method for manufacturing the same, the deposition processes may be any one of: electron beam deposition, magnetron sputtering, solgel deposition, and chemical vapor deposition. The etching processes may be any one of: wet etching, plasma dry etching, etc. Those skilled in the art may choose proper deposition and etching processes, as well as other suitable processes according to actual requirements. Any processes that are consistent with the principle of the present disclosure should fall within the scope of the present disclosure.

In summary, the present disclosure uses the asymmetric tunneling barrier layer for rectifying, so as to enable selection of the resistive random memory cell. The method for manufacturing the asymmetric tunneling barrier layer does not involve doping or high-temperature annealing processes, and the thickness of the asymmetric tunneling barrier layer is relatively small, which helps 3D high-density integration of the resistive random memory.

The objects, technical solutions and beneficial effects of the present disclosure have been further explained in detail in connection with the above specific embodiments. It should be understood that all of the above are only specific embodiments of the present disclosure but do not constitute a restriction to the present disclosure. Any modification, equivalent substitution, and improvement, etc., to within the spirit and principle of the present disclosure should be included in the scope of the present disclosure.

What is claimed is:

1. A resistive random memory cell, comprising an upper electrode, a resistive layer, an intermediate electrode, an asymmetric tunneling barrier layer, and a lower electrode, wherein:
the upper electrode, the resistive layer, and the intermediate electrode constitute a resistive storage portion;
the intermediate electrode, the asymmetric tunneling barrier layer, and the lower electrode constitute a selection portion;
the resistive storage portion and the selection portion share the intermediate electrode;
the selection portion is disposed above or under the resistive storage portion;
the asymmetric tunneling barrier layer comprises at least two materials having different barrier heights, and is configured for rectifying forward tunneling current and reverse tunneling current flowing through the resistive random memory cell.

2. The resistive random memory cell according to claim 1, wherein:
the at least two materials constituting the asymmetric tunneling barrier layer and their respective thicknesses are selected based on predetermined rectifying characteristics; and
the barrier heights of the at least two materials monotonously increase or monotonously decrease from bottom to top.

3. The resistive random memory cell according to claim 1, wherein:
the electrode at a high-barrier material side of the asymmetric tunneling barrier layer comprises a conductive material with a low work-function; and
the electrode at a low-barrier material side of the asymmetric tunneling barrier layer comprises a conductive material with a high work-function.

4. The resistive random memory cell according to claim 1, wherein:
the at least two materials having different barrier heights are selected from a group consisting of $SiO_2$, SiON, $Si_3N_4$, $HfO_2$, $Al_2O_3$, $ZrO_2$, HfAlO, HfSiO, AlSiO, $Ta_2O_5$, and $HfO_2$.

5. The resistive random memory cell according to claim 4, wherein:
the asymmetric tunneling barrier layer is a two-layer asymmetric tunneling barrier layer or a three-layer asymmetric tunneling barrier layer;
the two-layer asymmetric tunneling barrier layer is any one of: $SiO_2/Si_3N_4$, $SiO_2/Al_2O_3$, $SiO_2/HfO_2$, $SiON/HfO_2$, $SiON/Al_2O_3$, $Al_2O_3/HfO_2$, $Al_2O_3/SiO_2$, and $HfO_2/SiON$; and
the three-layer asymmetric tunneling barrier layer is any one of: $SiO_2/Al_2O_3/HfO_2$, $SiON/Al_2O_3/HfO_2$, and $SiO_2/SiON/HfO_2$.

6. The resistive random memory cell according to claim 5, wherein:
the at least two materials constituting the asymmetric tunneling barrier layer each have a thickness of 0.5~50 nm.

7. The resistive random memory cell according to claim 4, wherein:
the asymmetric tunneling barrier layer is formed by any one of: electron beam vaporization, chemical vapor deposition, pulse laser deposition, atom layer deposition, magnetron sputtering, and oxidation.

8. The resistive random access memory cell according to claim 1, wherein:
the resistive layer has a thickness of 1 nm~500 nm;
the resistive layer comprises one or more resistive material layers, or comprises a phase change storage material; and
the resistive layer is formed by any one or more of: electron beam vaporization, chemical vapor deposition, pulse laser deposition, atom layer deposition, spin coating, and magnetron sputtering.

9. The resistive random access memory cell according to claim 8, wherein:
the one or more resistive material layers comprise any one or two of the following materials, or comprise any one or two of the following materials modified by being doped: $NiO_x$ (0<x<=2); $TiO_x$ (0<x<=2); $CuO_x$ (0<x<=2); $ZrO_x$ (0<x<=2); $TaO_x$ (0<x<=2); $WO_x$ (0<x<=2); $HfO_x$ (0<x<=2); $AlO_y$ (1<y<2); CoO; MoO; ZnO; PCMO; LCMO; $SrTiO_3$; $BaTiO_3$; $SrZrO_3$; CuS; AgS; AgGeSe; $CuI_xS_y$ (0<x, y<2); $SiO_2$; $Y_2O_3$; Si; amorphous silicon; and organic materials; and
the phase change storage material comprises any one of: $Ge_2Sb_2Te_5$, GeTe, and GeTeC.

10. The resistive random access memory cell according to claim 1, wherein:
the upper electrode, the intermediate electrode, and the lower electrode each have a thickness of 1 nm~500 nm;
the upper electrode, the intermediate electrode, and the lower electrode each comprise any one or more of: W, Al, Cu, Au, Ag, Pt, Ru, Ti, Ta, Pb, Co, Mo, Ir, Ni, TiN, TaN, WN, $IrO_2$, ITO, NiSi, CoSi, IZO, YBCO, $LaAlO_3$, $SrRuO_3$, Si, and polysilicon; and
the upper electrode, the intermediate electrode, and the lower electrode are formed by any one of:
electron beam vaporization, chemical vapor deposition, pulse laser deposition, atom layer deposition, spin coating, and magnetron sputtering.

11. A resistive random memory, comprising a resistive read/write unit, an address selection unit, and a plurality of the resistive random memory cells according to claim 1, wherein:
the address selection unit is connected with the plurality of resistive random memory cells, and is configured for selecting the resistive random memory cell to be operated; and
the resistive read/write unit is connected with the address selection unit and the plurality of resistive random memory cells, and is configured for setting, resetting, or programming the selected resistive random memory cell.

* * * * *